United States Patent [19]
Linder et al.

[11] 3,962,553
[45] June 8, 1976

[54] PORTABLE TELEPHONE SYSTEM HAVING A BATTERY SAVER FEATURE

[75] Inventors: Donald L. Linder, Elmhurst; Orville M. Eness, Park Ridge; Charles N. Lynk, Jr., Arlington Heights, all of Ill.

[73] Assignee: Motorola, Inc., Schaumburg, Ill.

[22] Filed: Oct. 29, 1974

[21] Appl. No.: 518,827

Related U.S. Application Data

[63] Continuation of Ser. No. 346,203, March 29, 1973, abandoned.

[52] U.S. Cl. .......................... 179/41 A; 179/1 VC; 325/152; 325/22
[51] Int. Cl.² .................................... H04M 5/08
[58] Field of Search ............ 179/41 A, 1 VC, 81 B, 179/1 HF; 325/16, 22, 55, 64, 151, 152, 187; 343/176

[56] References Cited
UNITED STATES PATENTS

| | | |
|---|---|---|
| 3,104,392 | 9/1963 | Towler .............................. 325/22 |
| 3,169,221 | 2/1965 | Franchi ............................. 325/152 |
| 3,328,695 | 6/1967 | Ruthenberg ...................... 325/22 |
| 3,397,401 | 8/1968 | Winterbottom ................... 325/22 |
| 3,471,787 | 10/1969 | Morrison, Jr. .................... 325/22 |
| 3,473,055 | 10/1969 | Olson ............................... 325/152 |
| 3,586,978 | 6/1971 | Van Gorder ..................... 179/41 A |
| 3,626,112 | 12/1971 | Henquet .......................... 179/41 A |

*Primary Examiner*—Kathleen H. Claffy
*Assistant Examiner*—Gerald L. Brigance
*Attorney, Agent, or Firm*—James W. Gillman; Eugene A. Parsons

[57] ABSTRACT

A battery saving system for a portable duplex communications system such as a portable telephone system includes a voice operated transmitter within each portable unit which automatically transmits radio signals upon application of audio signals thereto and discontinues transmission upon termination of the audio signals to conserve battery power. A companion receiver includes a fast acting squelch system to substantially eliminate the noise bursts occurring between transmissions by said portable unit.

9 Claims, 3 Drawing Figures

3,962,553

1

PORTABLE TELEPHONE SYSTEM HAVING A BATTERY SAVER FEATURE

This a continuation of application Ser. No. 346,203 filed Mar. 29, 1973, now abandoned.

BACKGROUND

1. Field of Invention

This invention relates generally to communications systems, and more particularly to a battery saving system for a portable telephone system.

There are many applications wherein it is necessary to provide a battery saving system for a communications system. One such application for such a battery saving system is in a portable radio telephone system.

2. Prior Art

Several techniques for providing a battery saving system for communications system are known. Such systems generally employ a push to talk circuit wherein the transmitter of the portable unit is manually keyed by a push button or the like when it is desired to transmit a message, the transmitter normally being unkeyed when no message is being transmitted.

Whereas this system provides a way to reduce the power consumed by the portable unit, the system is impractical for portable telephone systems wherein automatic full duplex operation, such as is obtained with a normal telephone, is desired. Automatic full duplex operation has been provided in mobile telephone systems, which are mounted in vehicles, by rendering the mobile transmitter operative whenever the telephone hand set is removed from the cradle, however, the continuous operation of the mobile transmitter whenever the hand set is "off hook" requires more power than can be continuously provided by portable batteries, thereby making portable radio telephones impractical.

SUMMARY

It is an object of the present invention to provide a practical portable radio telephone system.

It is a further object of this invention to provide a battery saving system for the portable units of a radio telephone system which extends the battery life thereof sufficiently to make an automatic full duplex radio telephone system practical.

In accordance with a perferred embodiment of the invention, a voice operated transmitter is employed in each of the portable units. The voice operated transmitter is rapidly energized upon application of audio signals, such as speech, to the unit and remains energized for a predetermined time interval after the termination of the audio signal. Following the predetermined time interval, the transmission is terminated to conserve battery power during long pauses between phrases or sentences. The companion receiver, which receives the transmissions from the portable transmitter, employs a high speed squelch circuit which mutes the receiver sufficiently rapidly following the termination of each transmission to make the noise bursts, or "squelch tail", following each transmission substantially inaudible. Full duplex automatic operation is provided, thereby making the operation of the system much like that of a normal telephone system, and the need for a push to talk system to conserve battery power is eliminated.

2

DETAILED DESCRIPTION

Figure 1:
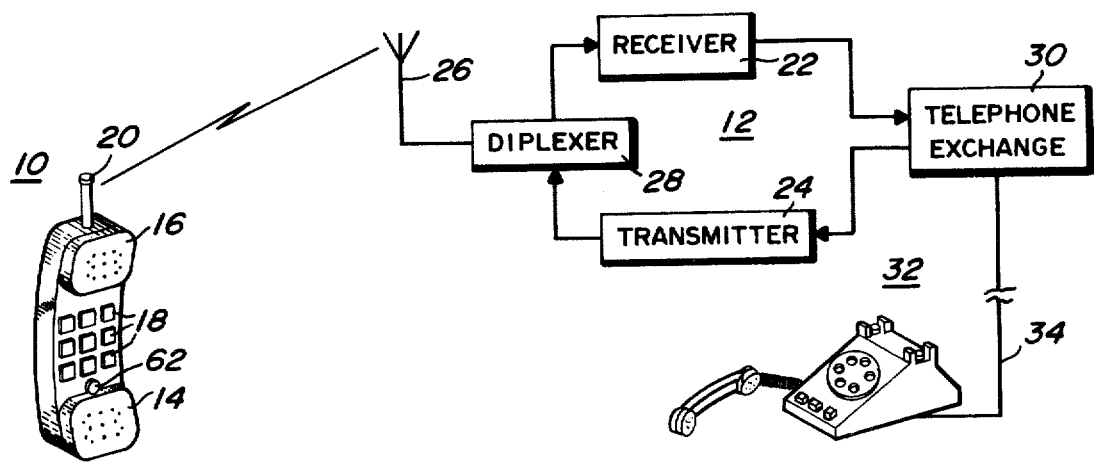
FIG. 1 shows a general block diagram of a portable radio telephone system utilizing the battery saver according to the invention.

Referring to FIG. 1, a portable unit 10 transmits signals to and receives signals from a base or fixed unit generally designated as 12. The portable unit 10 is shaped much like a hand set of a normal telephone and contains a microphone portion 14, an earphone portion 16 an off hook button 62 and a plurality of push buttons 18 which control a plurality of oscillators for generating signaling tones such as, for example, the Bell System Touch Tones. The portable unit 10 also includes a transmitter and a receiver (shown in FIG. 2) and an antenna 20.

The base station 12 includes a base station or fixed receiver 22 and a base or fixed transmitter 24. Both the receiver 22 and the transmitter 24 are connected to an antenna 26 by means of diplexer 28. The diplexer 28 has the property that signals from the transmitter 24 are applied to the antenna 26, but not to the receiver 22, whereas signals received by the antenna 26 are routed to the receiver 22. The diplexer 28 may consist of a circulator, well known in the art, or a pair of bandpass filters when the transmitter 24 and the receiver 22 operate at different frequencies. When bandpass filters are used, one bandpass filter tuned to the receiver frequency is interposed between the receiver 22 and the antenna 26, and a second bandpass filter tuned to the transmitter frequency is interposed between the transmitter 24 and the antenna 26. The receiver 22 and the transmitter 24 are each connected to a telephone exchange 30 by a pair of wire lines or other means. The telephone exchange 30, in turn, is connected to several telephones, such as the telephone 32 by means of a line such as line 34.

In operation, a telephone call may be initiated by either the portable telephone unit 10 or a standard telephone such as the telephone 32. To initiate a telephone call from either telephone, the number of the other phone is dialed. If the call is initiated by the telephone 32, the telephone 32 is connected to the base station 12 by means of the telephone exchange 30, and the transmitter 24 transmits signaling tones to the portable unit 10 indicative of the phone number of the unit 10 to cause the unit 10 to ring. Acknowledgement of the ring may be accomplished by depressing the off hook button 62 to activate the earphone in the unit 10. After acknowledgement, signals may be received by the unit 10 from the transmitter 24, and the unit 10 may transmit signals to the receiver 22 to put the portable unit 10 and the telephone 32 into voice contact with each other. A call may also be initiated from the portable unit 10 by dialing the phone number of the unit 32 by depressing the appropriate buttons 18 to send signaling tones to the receiver 22. The signaling tones received by the receiver 22 are decoded at the telephone exchange 30 to cause the telephone exchange 30 to select and ring the telephone 32. Picking up the hand set of the telephone 32 places the telephone 32 in voice contact with the portable unit 10.

The operation described above is well known in the art and is similar to the operation of the Bell System Improved Mobile Telephone Service, commonly known as the IMTS system.

In radio telephone systems of the type described above, it is desirable to make the operation of the portable unit 10 as much like the operation of a normal telephone, such as a telephone 32, as is possible. In order to achieve the aforementioned goal of telephone like operation, both the portable unit 10 and the fixed station 12 transmit and receive simultaneously on different frequencies to allow each user to talk while the other user is speaking and to allow each user to interrupt the other user as can be done with a normal telephone. This type of operation is known as full duplex operation. Full duplex operation has the advantage that no user has to wait until another user has finished speaking before he can speak as is the case in non-duplex or simplex radio system.

One of the disadvantages of a full duplex system is that once contact has been made between the portable and the base units, the transmitter of the portable unit must remain on for the duration of the conversation to provide the duplex operation. The power required by a radio transmitter is relatively high and has to date precluded the use of truly portable telephones due to the large batteries required to power the transmitter throughout the conversation. Consequently, present portable telephones are actually mobile type telephones which are installed in automobiles and utilize the large automobile battery to provide power for the continuously operating mobile transmitter. Hand held portable units are presently push to talk two way radio type units which do not provide telephone like operation.

Figure 2:
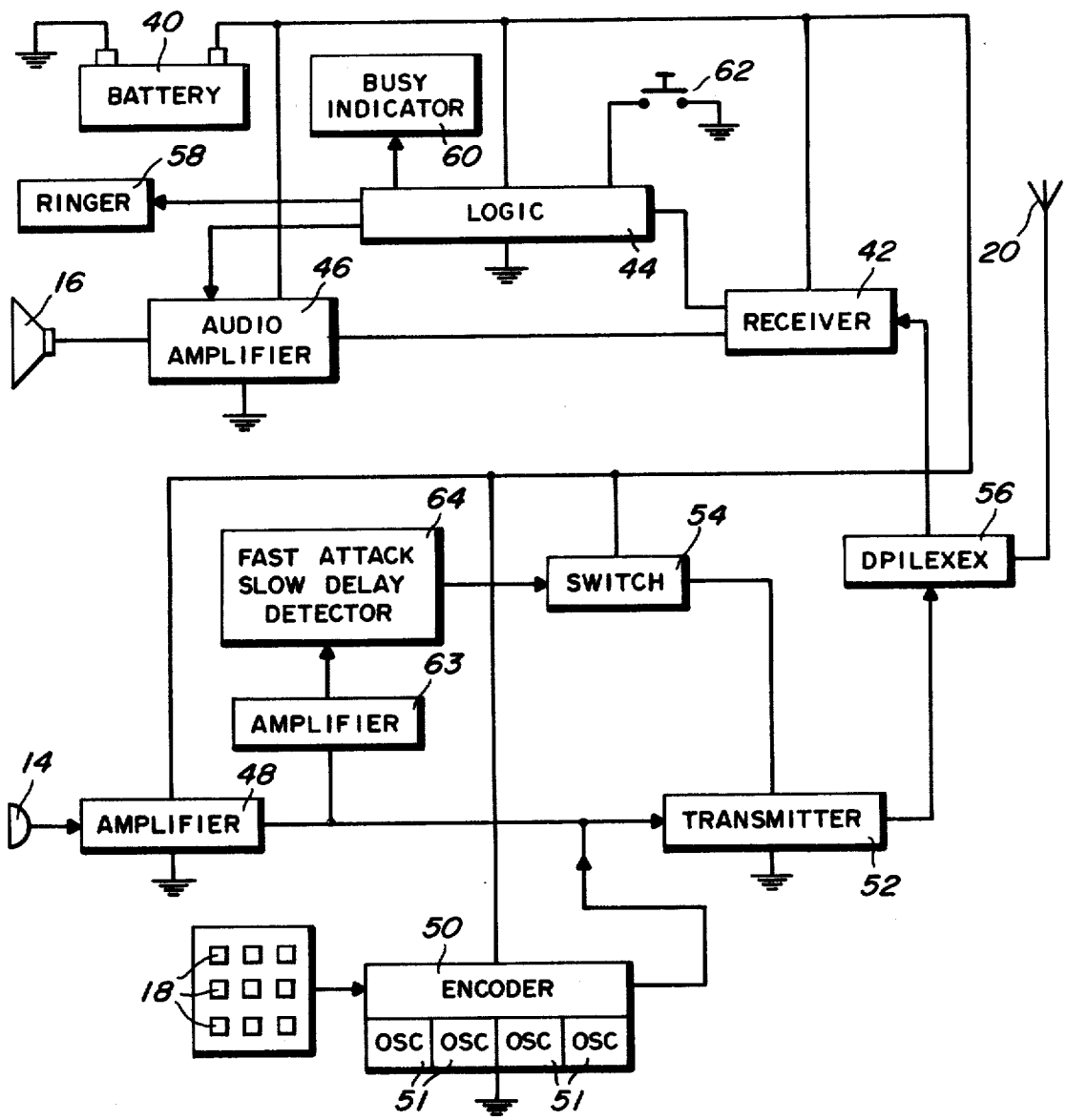
FIG. 2 is a block diagram of the portable unit shown in FIG. 1.

Referring to FIG. 2, there is shown a block diagram of the portable unit 10 showing the battery saver feature according to the invention which provides telephone like operation in a truly portable hand held unit. A battery 40 is connected to a radio receiver 42, a logic circuit 44, a pair of audio amplifiers 46 and 48, an encoder 50, having a plurality of tone generating oscillators 51, and a transmitter 52 through a switch 54. The receiver 42 is also connected to the antenna 20 through a diplexer 56, and to the logic circuit 44 and the audio amplifier 46. The audio amplifier 46 is connected to the earphone 16 and to the logic circuit 44, which is in turn connected to a ringer 58, busy indicator 60 and the off hook indicator 62. The transmitter 52 is also connected to the antenna 20 through the diplexer 56 and to the encoder 50 which is in turn connected to the push buttons 18. The amplifier 48 is connected to the microphone 14, the transmitter 52 and another amplifier 63. Amplifier 63 is connected to a fast attack slow decay voice detector 64, which is connected to the switch 54. The amplifier 63 may be a class C amplifier which remains biased off until the signal applied thereto exceeds a predetermined level to prevent keying of the transmitter by low level extraneous ambient noise.

In operation, signals received by the receiver 42 are applied to the logic circuit 44 which decodes the signals in a well known manner to cause the ringer 58 to ring when a signal representing the phone number of the unit 10 has been received. The portable unit is answered by activating the off hook switch 62. Activating the off hook switch 62 terminates the ringing and causes the logic circuit 44 to unmute the normally muted audio amplifier 46 to allow audio signals from the receiver 42 to be amplified and applied to the earphone 16. The transmitter 52 normally remains inoperative unless a signal is applied thereto from the amplifier 48 or the encoder 50. To initiate a call from the portable unit, the phone number of the telephone to be called is dialed using the push buttons 18. The signals from the push buttons 18 cause the tone generating oscillators 51 in the encoder 50 to generate tones and apply the tones to the transmitter 52. The presence of the tones is detected by the fast attack slow decay detector 64 which operates the switch 54 to energized the transmitter 52. If all of the channels are busy, the receiver 42 will receive a busy indication which will be applied to the logic circuit 44 to cause the busy indicator 16 to indicate a busy signal. Once contact is made between the portable unit and a land telephone, such as telephone 32, the transmitter 52 is keyed by speaking into the microphone 14. Signals from the microphone 14 are amplified by the amplifier 48 and amplifier 63 and are detected by the detector 64 to operate the switch 54 to energized the transmitter 52. When a class C amplifier is employed for amplifier 63, the signal from the microphone 14 must exceed a predetermined level before the amplifier 63 provides signals to the detector 64, thus maintaining the transmitter inoperative until such level is exceeded. The signals from the amplifier 48 are also applied to the transmitter 52 to modulate the transmitter with the voice signal. The time constants of the detector 64 are chosen such that the transmitter is rapidly keyed upon the application of voice to the microphone 14, and the decay time is such that the transmitter is maintained operative for a predetermined time interval following the termination of the speech. In a typical system, the attack time is on the order of less than 10 milliseconds, preferably 5 milliseconds or less to assure that substantially all of the speech is transmitted, and the decay time is on the order of more than one half second, and preferably to prevent unnecessary switching of the transmitter during short pauses. Fast attacks, slow decay detectors are well known in the art, and may be constructed utilizing a non-linear element, such as a diode or a transistor, to charge a capacitor at a fast rating and a resistor to discharge the capacitor at a second rate. Hence, as a result of the operation of the switching circuit and the speech detector, the transmitter is energized or keyed only when the user is speaking and is turned off to conserve battery power when the user is listening to the other half of the conversation. Full duplex operation and automatic keying is maintained to provide telephone like operation while substantially conserving battery power. Furthermore, because the system is duplex, the problems associated with the use of voice operated transmitters in a single frequency simplex system, including the locking up of the channel in the event of noise fasing are eliminated.

Figure 3:
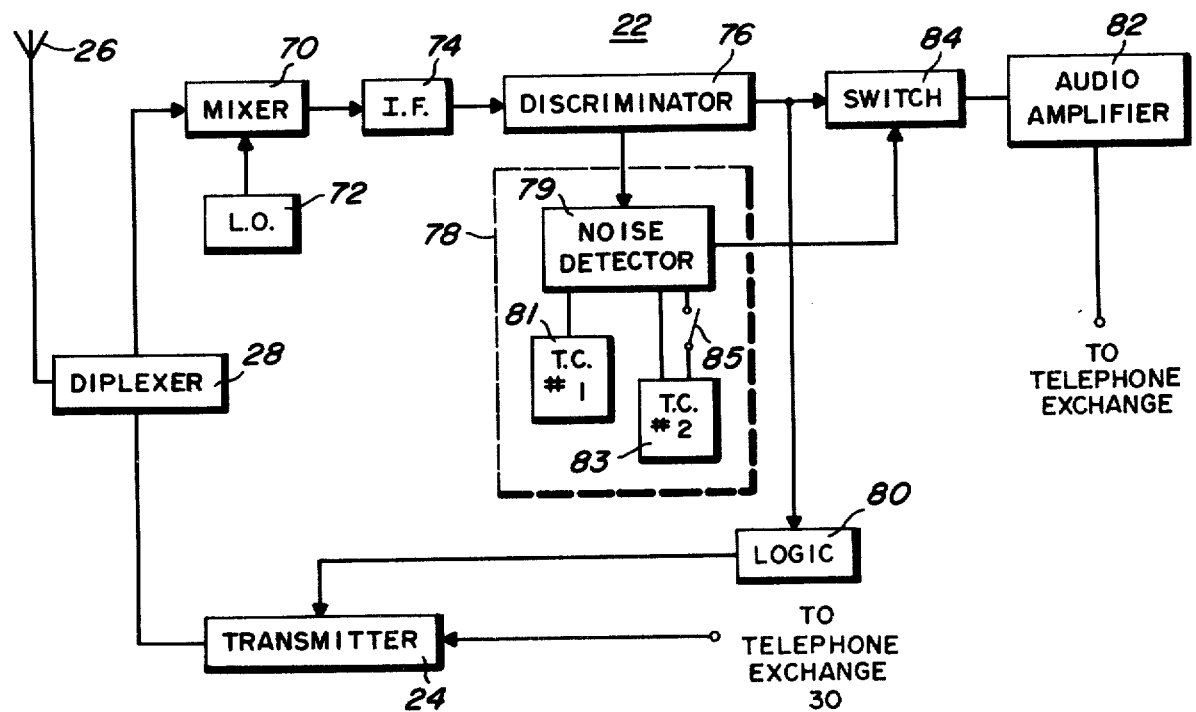
FIG. 3 is a more detailed block diagram of the base or fixed station shown in FIG. 1.

Referring to FIG. 3, there is shown a more detailed block diagram of the base station 12. The receiver 22 comprises, for example, a mixer 70 connected to the diplexer 28, to local oscillator 72 and to an intermediate frequency amplifier 74. A frequency modulation detector, in this embodiment discriminator 76, is connected to the intermediate frequency amplifier 74, and to a dual time constant squelch 78 having a noise detector 79, a short time constant filter 81, a long time constant filter 83, and switch 85. The discriminator 76 is also connected to a logic circuit 80 and to an audio amplifier 82 through a switch 84. The switch 84 is also connected to the dual time constant squelch 78. Alternately, the audio amplifier 82 may contain a switch similar to switch 84 which may be controlled by the dual time constant squelch 78. The transmitter 24 is connected to the diplexer 28 and to the logic circuit 80. The output of the audio amplifier 82 and an input of the transmitter 24 are connected to the telephone exchange by means of an appropriate transmission medium such as a telephone line.

In an FM receiver such as the receiver 22, the discriminator 76 generates noise when no signal is received by the receiver. Hence, as the portable transmitter is keyed on and off, noise is present at the output of the discriminator 76 during the time that the portable transmitter is not transmitting. The aforementioned noise must be prevented from reaching the telephone line to avoid annoying noise bursts during pauses in the speech of the portable telephone user. This is accomplished by the dual time constant squelch 78 and the switch 84. The dual time constant squelch 78 senses the presence of noise at the discriminator 76 and generates a signal to open the switch 84 when noise is present to prevent the noise from being applied to the audio amplifier 82 and the telephone line. The dual time constant squelch 78 has a response time of less than 10 milliseconds and is, in a preferred embodiment, a fast acting squelch having a response time of less than 5 milliseconds in order that the switch 84 may be opened as rapidly as possible following the termination of the transmission from the portable unit to prevent annoying noise bursts or squelch tails from being applied to the telephone line after each transmission. In a preferred embodiment the dual time constant squelch may be of the type described in U.S. Pat. No. 3,628,058 to Roy Espe entitled Integrated Dual Time Constant Squelch Circuit, filed Feb. 24, 1970 and assigned to Motorola, Inc. The aforementioned squelch circuit has two modes of operation, including a short time constant mode which provides a response time on the order of less than 5 milliseconds in a preferred embodiment, and a long time constant mode which provides a response time on the order of a few hundred milliseconds. The squelch circuit automatically operates in the short time constant mode to provide a fast response time when the signal being received by the receiver exceeds a predetermined level, such as, for example one-half microvolt. The squelch circuit automatically reverts to the long time constant mode when the received signal is below the predetermined level to prevent the squelch from interrupting the audio during fades or nulls in a relatively weak received signal. The long time constant mode also provides for improved squelch sensitivity and a more easily adjustable squelch circuit than could be achieved with a squelch circuit having only a short time constant mode. The dual time constant squelch has been found to provide satisfactory operation even though a noise burst may occasionally be heard when the portable unit is being operated sufficiently far away from the base station to cause the dual time constant squelch to operate in the long time constant mode. Should the elimination of all squelch tails or noise bursts be desired, a squelch circuit similar to the dual time constant squelch circuit 78 but having only a short time constant may be employed, particularly in systems wherein the signals to be received by the base station are relatively strong and the long time constant is not required.

Although a particular embodiment of the battery saving feature which makes a portable telephone system practical has been shown, it should be noted that any embodiment employing the concepts described in the foregoing falls within the scope and spirit of the invention.

We claim:

1. A full duplex radio communication system including in combination:

a base station having base frequency modulated transmitter means for providing radio signals having a first carrier frequency and base frequency modulated receiver means including frequency modulation detector means for simultaneously receiving radio signals having a second carrier frequency different than said first carrier frequency, said base receiver means having an audio output circuit and noise operated squelch circuit means for muting said audio output circuit, said squelch circuit means being connected to the frequency modulation detector means of said base receiver means and responsive to radio frequency signals received by said base receiver for rendering said audio output circuit operative upon receipt of radio signals by said base receiver and for muting said output circuit upon termination of said received radio frequency signals, said squelch circuit having a response time of less than approximately 10 milliseconds for rendering said audio output circuit operative in substantial synchronism with the receipt of said second carrier frequency radio signals, and for rapidly muting said audio output circuit upon termination of said received radio signals to render noise bursts provided by said base receiver means in the absence of received signals substantially inaudible; and a personal portable unit adopted to be carried by an individual and having portable transmitter means for providing radio frequency signals having said second carrier frequency and portable receiver means for simultaneously receiving radio signals having said first carrier frequency, said portable unit including a battery sufficiently small to be carried easily by the individual operating said portable unit for providing limited power to said portable unit, said portable unit having transducer means connected to said portable transmitter means for receiving voice signals and modulating said transmitter in accordance therewith, and voice detector means connected to said transducer means and to said portable transmitter means, said voice detector means being responsive to the voice signals applied to said transducer means for rendering said transmitter means operative within less than approximately 5 milliseconds following the application of voice signals to said transducer means to provide said second carrier frequency radio signals when voice signals are applied to said transducer means and for maintaining said portable transmitter means operative for more than approximately one-half second following the termination of said voice signals, said transmitter means being rendered inoperative with no signals applied to said voice detector.

2. A radio communication system as recited in claim 1 wherein said base station includes means for connecting said base transmitter means and said base receiver means to a telephone network.

3. A radio communication system as recited in claim 2 wherein said portable unit includes a circuit for generating a plurality of signaling tones connected to said portable transmitter means, and a plurality of push buttons for rendering said tone generating circuit operative to generate predetermined ones of said signaling tones for modulating said portable transmitter means.

4. A radio communication system as recited in claim 3 wherein said signaling circuit is coupled to said voice detector means, said voice detector means being responsive to tones generated by said signaling circuit for rendering said portable transmitter means operative.

5. A radio communication system as recited in claim 1 wherein said squelch circuit means includes means for extending the response time thereof upon receipt of a signal by said base receiver means having an amplitude below a predetermined level.

6. A radio communication system as recited in claim 4 wherein said voice detector means includes means for maintaining said portable transmitter means inoperative until said voice signals exceed a predetermined amplitude.

7. In a telephone system a duplex, battery powered personal portable unit small enough to be easily carried by an individual having a portable transmitter and a portable receiver, and a fixed station having a fixed transmitter and a fixed receiver for transmitting radio signals to and receiving radio signals from said portable unit, the method of conserving the battery power of the portable unit, comprising the steps of:
providing a voice responsive circuit coupled to said portable transmitter, said voice responsive circuit being operative to cause said portable transmitter to transmit radio signals in response to audio signals applied thereto, and to render said portable transmitter inoperative upon termination of said audio signals;
applying audio signals to said voice responsive circuit to render said portable transmitter operative to transmit radio signals in response to said audio signals; and
providing muting means connected to said fixed receiver, said muting means being responsive to radio signals received by said fixed receiver to render said fixed receiver operative to provide audio signals in response to said radio signals and to mute said receiver in the absence of radio signals, said muting means having a rapid response time to render said fixed receiver operative in substantial synchronism with the operation of said transmitter, and to rapidly mute said receiver upon termination of said radio signals to render noise bursts generated by said fixed receiver upon termination of said radio signals substantially inaudible.

8. A duplex radio telephone system for use in conjunction with a telephone network, said system including in combination:
fixed station frequency modulated receiver means including an FM detector circuit for providing audio signals to said telephone network in response to radio signals received thereby, said receiver means providing noise signals in the absence of received radio signals;
personal portable transmitter means powered by a battery small enough to be easily carried by an individual for transmitting radio signals to said fixed station receiver means;
voice responsive switch means connected to said portable transmitter means, said voice responsive switch means being responsive to voice signals applied thereto for rendering said portable transmitter means operative to transmit radio signals in response to said voice signals and rendering said portable transmitter means inoperative when no signal is applied to said switch means;
coupling means connected to said fixed station receiver means for applying said audio signals to said telephone network;
squelch means including a noise operated squelch circuit connected to the FM detector circuit of said fixed station receiver means and to said coupling means, said squelch means being responsive to said receiver means for rendering said coupling means operative to apply said audio signals to said telephone network when radio signals are received by said receiver means, and responsive to noise signals generated by the FM detector circuit of said receiver means for rendering said coupling means inoperative to prevent the application of the noise signals to said telephone network in the absence of radio signals, said squelch means having a response time of less than approximately 10 milliseconds for rendering said coupling means operative in substantial synchronism with the operation of said portable transmitter means to substantially prevent the application of the noise signals to said telephone network upon termination of said radio signals.

9. A radio telephone system as recited in claim 8 wherein said squelch circuit includes means for extending the response time thereof to more than 100 milliseconds.

* * * * *